United States Patent [19]

Lee et al.

[11] Patent Number: 5,801,096
[45] Date of Patent: Sep. 1, 1998

[54] SELF-ALIGNED TUNGSEN ETCH BACK PROCESS TO MINIMIZE SEAMS IN TUNGSTEN PLUGS

[75] Inventors: Chung-Kuang Lee; Pin-Nan Tseng, both of Hsin-Chu, Taiwan

[73] Assignee: Taiwan Semiconductor Manufacturing Company Ltd., Hsin-Chu, Taiwan

[21] Appl. No.: 658,523
[22] Filed: Jun. 3, 1996
[51] Int. Cl.6 .................................................. H01L 21/441
[52] U.S. Cl. .......................... 438/636; 438/648; 438/637; 438/685; 438/906
[58] Field of Search .................................. 438/636, 637, 438/675, 672, 648, 688, 906, 685, 680

[56] References Cited

U.S. PATENT DOCUMENTS

| | | |
|---|---|---|
| 5,043,299 | 8/1991 | Chang et al. . |
| 5,316,975 | 5/1994 | Maeda . |
| 5,332,691 | 7/1994 | Kinoshita et al. ................ 437/192 |
| 5,407,861 | 4/1995 | Marangon et al. ............... 437/192 |
| 5,420,072 | 5/1995 | Fiordalice et al. ............... 437/192 |
| 5,422,310 | 6/1995 | Ito ...................................... 437/192 |
| 5,486,266 | 1/1996 | Tsai et al. . |
| 5,506,177 | 4/1996 | Kishimoto et al. . |
| 5,529,670 | 6/1996 | Ryan et al. . |
| 5,580,823 | 12/1996 | Hedge et al. . |
| 5,622,894 | 4/1997 | Jang et al. . |
| 5,641,710 | 6/1997 | Wang et al. . |
| 5,654,233 | 8/1997 | Yu . |
| 5,702,983 | 12/1997 | Shinohara . |

FOREIGN PATENT DOCUMENTS 7-130 852  2/1995  Japan .

OTHER PUBLICATIONS

S. Wolf "Silicon Processing for the VLSI Era: vol. 2" Lattice Press (Calif.) p. 192, 1990.

Primary Examiner—Caridad Everhart
Attorney, Agent, or Firm—George O. Saile; Stephen B. Ackerman

[57] ABSTRACT

A process for creating tungsten plugs, to fill high aspect ratio contact holes, has been developed. Narrow seams in the center of a tungsten plug, are protected from the tungsten RIE etch back process, thus avoiding the creation of larger seams or voids. This is accomplished by delaying the tungsten RIE etch back step until formation of an overlying interconnect metallization structure, which will protect the underlying tungsten plug, and seam, during the subsequent tungsten RIE etch back procedure.

20 Claims, 5 Drawing Sheets

SELF-ALIGNED TUNGSEN ETCH BACK PROCESS TO MINIMIZE SEAMS IN TUNGSTEN PLUGS

BACKGROUND OF THE INVENTION (1) Field of the Invention

This invention relates to methods used to fabricate semiconductor devices, and more specifically to a process used to fill contact holes with tungsten.

(2) Description of Prior Art

The semiconductor industry is continually striving to increase the performance of silicon devices, while still maintaining, or lowering the cost of manufacturing these higher performing devices. The trend to microminiaturazation, or the ability to produce silicon devices with sub-micron features, has allowed the performance and cost objectives to be realized. The use of sub-micron features has resulted in the attainment of smaller chips, allowing more silicon chips to be obtained from a specific size starting silicon wafer, thus reducing the cost of a specific silicon chip. In addition the reduction in critical device dimensions, has resulted in higher performing devices via reductions in performance degrading resistances and capacitances. However the use of sub-micron features can also increase the risk of yield and reliability failures.

As contact or via holes decrease in size, regarding the diameter of contact hole opening, the aspect ratio, or the ratio of the depth of the contact hole, to the diameter opening, becomes large. These high aspect ratio contact holes are now more difficult to fill with conventional metallization processes, then counterparts with smaller aspect ratios. The use of aluminum based metallizations, for filling high aspect ratio contact holes, encounters many problems. First conventional aluminum deposition techniques, such as sputtering or evaporation, have difficulty in conformally filling these deep, narrow, contact holes, which can result in yield problems. In addition the inability of aluminum based metallizations, to sustain the higher current densities, needed with the smaller contact holes, can ultimately result in electromigration, reliability failures. Therefore the semiconductor industry has evolved to the use of tungsten for filling narrow, deep contact, or via holes.

The switch to tungsten filled contact holes was made to take advantage of the improved conformality, or step coverage, resulting from the use of a low pressure chemical vapor deposition, (LPCVD), process. In addition the high current carrying characteristics of tungsten, remove the risk of electromigration failures. However the characteristics of LPCVD depositions is to basically fill holes by depositing on the sides of the hole. Sometimes at the completion of the tungsten fill, a buried seam, or void, is present at a point where the depositing tungsten, on the sides of the contact hole, converge. This buried seam, or void, can be exposed during subsequent processing, such as dry etching procedures used to remove unwanted tungsten from regions other then the contact hole. The size of the seam or void in the tungsten fill can be increased due to exposure to the dry etching procedure, creating a difficult topology for subsequent metallization coverage. Therefore many processes have been developed, either attempting to create seamless tungsten contact hole fills, or repairing of the seam or void in the tungsten fill.

Marangon, et al, in U.S. Pat. No. 5,407,861, have described a process for removing unwanted tungsten, from areas outside the contact hole, via use of a two stage, dry etching procedure. This process features a reduction in the removal rate of tungsten at the completion of residual removal, thus not significantly attacking the exposed tungsten in the contact hole.

This invention will describe a process in which the tungsten etch back procedure, which can aggravate an exposed, existing seam in the tungsten fill, is delayed to a stage in the process in which the tungsten fill, with an exposed seam, is protected by an overlying interconnect metallization structure. The patterning of the interconnect metallization structure, in terms of photolithographic and RIE processing, is immediately followed by the self-aligned, insitu RIE procedure to remove tungsten from the area not covered by the interconnect metallization structure, thus shielding the underlying tungsten plug, in the contact hole, from RIE procedures that would have enlarged the seam in the tungsten fill.

SUMMARY OF THE INVENTION

It is an object of this invention to provide a process for fabricating tungsten filled contact holes, to be used to connect active silicon device regions, in a semiconductor substrate, to an overlying metallization.

It is another object of this invention to completely fill small diameter, deep contact holes, with chemically vapor deposited tungsten.

It is another object of this invention to deposit an overlying interconnect metallization layer, on the underlying tungsten layer, and pattern the interconnect metallization layer via dry etching procedures, to form an interconnect metallization structure, completely overlying the tungsten filled contact hole.

It is still another object of this invention to remove tungsten from areas not covered by the interconnect metallization structure, via a self-aligned, dry etching procedure.

It is still yet another object of this invention to provide an additional, self-aligned, dry etching procedure, to insure complete removal of unwanted tungsten form areas not covered by the interconnect metallization structure.

In accordance with the present invention a process is described for fabricating tungsten filled contact holes, in which removal of unwanted tungsten is performed using an interconnect metallization structure to protect an underlying tungsten plug, in a small diameter contact hole, during the self-aligned tungsten etch back process. A contact hole is opened in a dielectric layer, to an active device region in a semiconductor substrate. A layer of titanium, to be used for adhesion and contact purposes, and a layer of titanium nitride, to be used as a barrier to protect underlying materials from subsequent process reactants, are deposited. A layer of chemically vapor deposited tungsten is used to completely fill the small diameter contact hole. An interconnect metallization layer is deposited and patterned, using photolithographic and dry etching procedures. The resulting interconnect metallization structure is then used as a mask to remove tungsten, as well as the underlying titanium nitride and titanium layers, from areas not covered by the interconnect metallization structure, creating a tungsten plug in the small diameter contact hole. The overlying interconnect metallization structure, used as a mask to allow self-aligned patterning of the tungsten plug, also protected the tungsten plug from any tungsten overetch procedures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating a tungsten filled contact hole, without creating a damaging seam during post-tungsten deposition, will now be described. This invention can be used as part of metal oxide semiconductor field effect transistor, (MOSFET), devices, that are currently being manufactured in industry, therefore only the specific areas unique to understanding this invention will be covered in detail.

Figure 1:
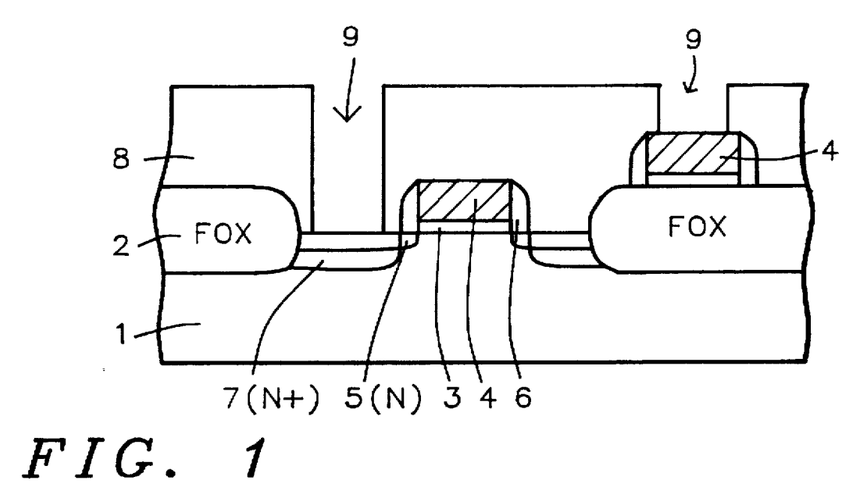
FIG. 1, which schematically, in cross-sectional style, shows a silicon device, at a stage prior to tungsten contact hole filling.

FIG. 1, schematically shows a typical N channel, (NFET), device, that contact holes filled with tungsten, will be applied to. A substrate, 1, composed of a P type, single crystalline silicon, with a <100> crystallographic orientation, is used. Thick field oxide, (FOX), regions, 2, used for isolation purposes, are formed using an oxidation masking pattern composed of an overlying silicon nitride layer, and an underlying silicon dioxide layer. The composite insulator mask is patterned using conventional photolithographic and reactive ion etching, (RIE), processes. After photoresist removal, via plasma oxygen ashing and careful wet cleans, a silicon dioxide, FOX region, 2, is formed via a oxygen—steam, thermal oxidation, at a temperature between about 850° to 1050° C., to a thickness between about 4000 to 6000 Angstroms. After removal of the composite insulator oxidation mask, using hot phosphoric acid for the silicon nitride layer, and a buffered hydrofluoric acid solution for the underlying silicon dioxide layer, a thin silicon dioxide, gate insulator, 3, is grown in an oxygen—steam ambient, at a temperature between about 800° to 1000° C., to a thickness between about 50 to 300 Angstroms. A polysilicon layer is intrinsically deposited using LPCVD processing, at a temperature between about 500° to 700° C., to a thickness between about 1500 to 4000 Angstroms. Ion implantation of arsenic or phosphorous is next performed at an energy between about 50 to 100 Kev., at a dose between about 1E15 to 1E16 atoms/cm², for purposes of doping the intrinsic polysilicon layer. Another alternative is to eliminate the ion implantation step by depositing the polysilicon layer using insitu doping procedures, by adding either phosphine or arsine to the silane ambient during the LPCVD procedure. Standard photolithographic and RIE procedures, using $Cl_2$ as an etchant, are used to create polysilicon gate structure, 4, shown in FIG. 1.

After removal of the photoresist pattern, used to define polysilicon gate structure, 4, via plasma oxygen ashing and careful wet cleans, an ion implantation of phosphorous is performed at an energy between about 30 to 60 Kev., at a dose between about 1E12 to 5E13 atoms/cm², creating lightly doped source and drain region, 5. A silicon oxide layer is next deposited, using either LPCVD or plasma enhanced chemical vapor deposition, (PECVD), processing, at a temperature between about 500° to 800° C., to a thickness between about 1500 to 4000 Angstroms, using tetraethylorthosilicate as a source. An anisotropic, RIE procedure, using $CHF_3$ as an etchant, follows, resulting in insulator sidewall spacer, 6, being created on the exposed sides of polysilicon gate structure, 4. Another ion implantation procedure, using arsenic at an energy between about 50 to 100 Kev., at a dose between about 1E14 to 5E15 atoms/cm², is performed to create heavily doped source and drain region, 7, shown schematically in FIG. 1.

A layer of silicon oxide, 8, is deposited, again using either LPCVD, PECVD, or atmospheric pressure chemical vapor deposition, (APCVD), processing, at a temperature between about 400° to 800° C., to a thickness between about 5000 to 10000 Angstroms, and planarized using conventional chemical mechanical procedures. Photolithographic and RIE procedures, using $CHF_3$ as an etchant, are performed to open contact hole, 9. To satisfy the increased performance objectives, aggressive designs, necessitating contact holes with sub-micron features, are used. Contact hole 9, is fabricated with a diameter opening between about 0.3 to 0.5 uM. This small opening, along with the depth of the contact hole, results in a high aspect ratio contact hole, which can create difficulties when attempting to fill with conventional metallization processes. FIG. 1, schematically shows this structure after photoresist removal, again via use of plasma oxygen ashing, followed by careful wet cleans, with contact hole, 9, opened to heavily doped source and drain region, 7, as well as to a polysilicon gate structure, 4, residing on FOX region, 2.

Figure 2:
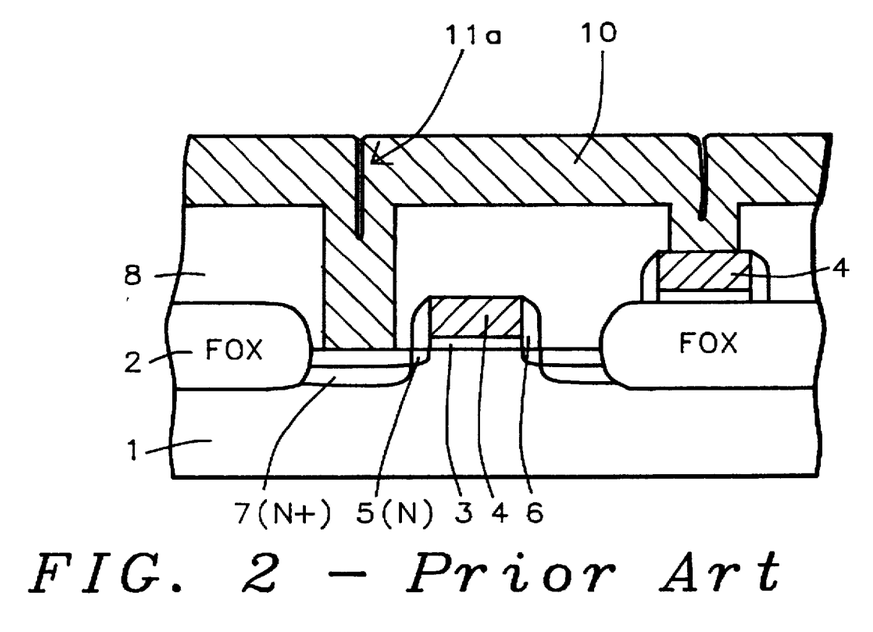
FIGS. 2–4, which schematically, in cross-sectional style, show prior art, in which fabrication sequences, used to create tungsten filled contact holes, aggravated the seams in the tungsten fill.
Figure 3:
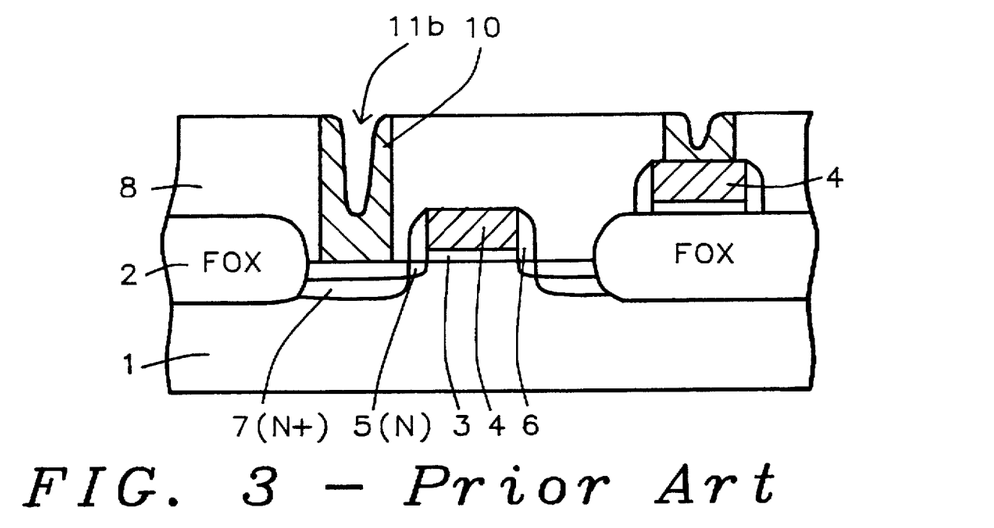
Figure 4:
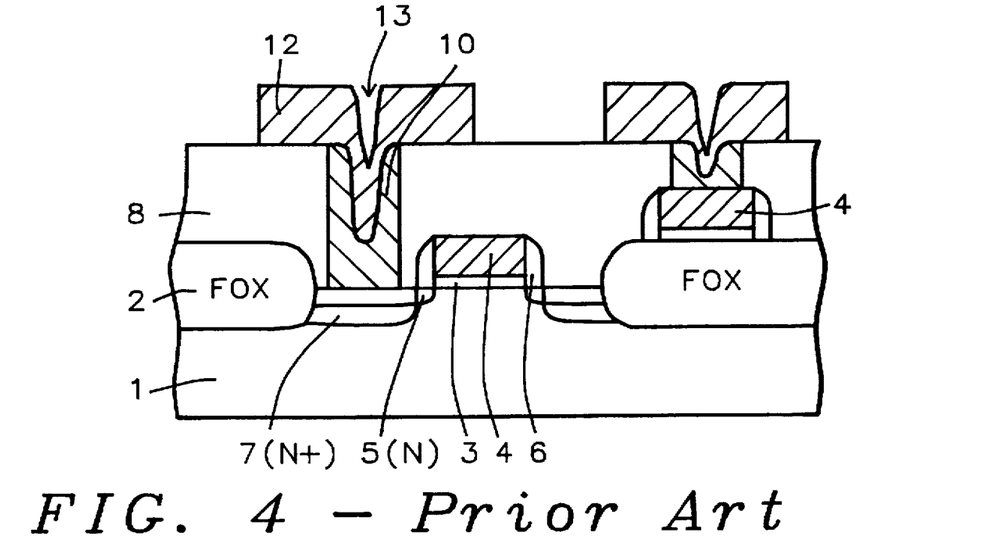

Attempts at fabricating tungsten filled, small diameter, contact holes, and the effects of subsequent process sequences, are schematically shown in FIGS. 2–4. FIG. 2, shows the result of an tungsten LPCVD deposition, using tungsten hexafluoride as a source, attempting to fill high aspect ratio, contact hole, 9. The deposition of tungsten layer, 10, is performed at a temperature between about 400° to 500° C., to a thickness between about 2000 to 8000 Angstroms. The filling of contact hole, 9, takes places by tungsten deposition on the sides of the contact hole. At the conclusion of the deposition procedure it is likely that a seam, 11a, in the tungsten fill, exists, due to the pinching or closing effect occurring when the sidewall tungsten layers converge. Subsequent removal of unwanted tungsten, using RIE processing, from areas other then the contact hole, can expose seam 11a, and create a larger defect, such as opening, 11b, shown schematically in FIG. 3. The consequence of opening 11b, is realized when overlying interconnect metallizations, such as an r.f. sputtered aluminum based structure, 12, can not adequately fill opening 11b, resulting in a thin aluminum layer in region 13, shown schematically in FIG. 4 The thin aluminum layer is now vulnerable to electromigration failures due to the increased current densities that will be present due to the poor aluminum coverage in region 13.

Figure 5:
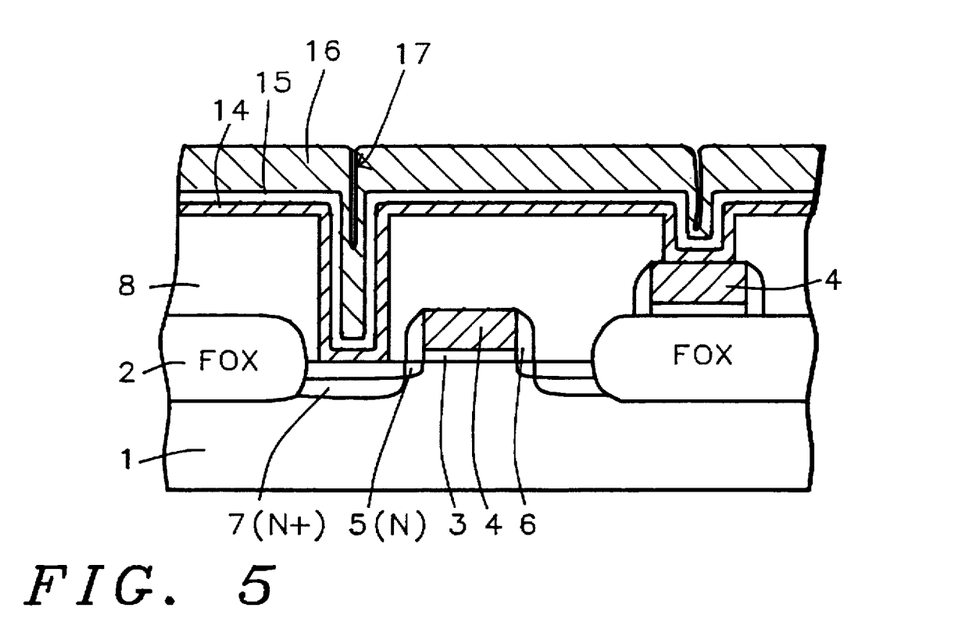
FIGS. 5–9, which schematically, in cross-sectional style, show the stages of fabrication, used to create tungsten filled contact holes, without deleterious enlargement of the tungsten seam during subsequent processing steps.

A process will now be described in which a seam in a tungsten fill will not be subjected to subsequent process steps, thus avoiding the deleterious effects previously described in FIGS. 2–4. Again, applying this invention to the MOSFET device shown in FIG. 1, a buffered hydrofluoric acid pre-clean is performed, followed by the deposition of a titanium layer, 14, obtained via collimated, r.f. sputtering, to a thickness between about 150 to 250 Angstroms. The titanium layer, 14, shown in FIG. 5, is used to provide a low resistance contact to underlying, heavily doped source and drain regions, 7, and also provides excellent adhesion to the silicon oxide sidewalls, of contact hole, 9. The use of collimation for the deposition procedure allows for a more effective deposition of titanium, at the bottom of contact hole, 9, then would have existed with non-collimated counterparts. Next a layer of titanium nitride, 15, is deposited, using LPCVD procedures, at a temperature between about 200° to 600° C., to a thickness between about 100 to 200 Angstroms, using $TiCl_4$ and $NH_3$ as a source. The barrier layer of titanium nitride, 15, offers protection to underlying materials, during the subsequent tungsten depositions. The decomposition of tungsten hexafluoride occurs with the evolution of by-products which would attack the underlying titanium layer, 14, if the barrier layer of titanium nitride were not present. Next a layer of tungsten, 16, is deposited, using LPCVD processing, at a temperature between about 100° to 500° C., to a thickness between about 2000 to 8000 Angstroms, using tungsten hexafluoride and silane. Contact hole, 9, has been formed to a depth of between about 5000 to 10000 Angstroms, and with an opening, having a diameter between about 0.3 to 0.5 uM, thus resulting in aspect ratios between about 1 to 3. These large aspect ratios can present problems when attempting to fill with LPCVD tungsten. It is likely that seam, 17, similar to seam, 11a, previously shown in FIG. 2, can form in the center of the tungsten fill, in the contact hole, due to the convergence of the tungsten coated sidewalls. This is shown schematically in FIG. 5.

Figure 6:
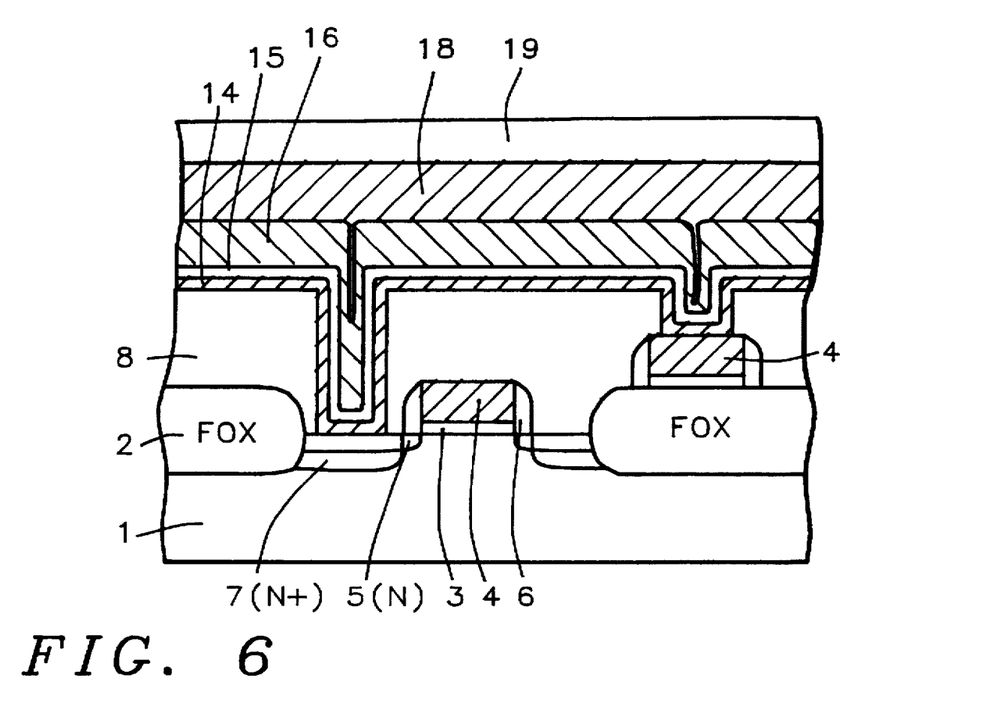

Prior art, shown previously in FIGS. 2–3, would next apply an selective, dry etch back process, used to remove unwanted tungsten from areas outside the contact hole region, forming a tungsten plug in the contact hole. However the exposed seam in the center of the tungsten fill, would be exposed to the etch back procedure, and then to an additional dry etch procedure, used to insure complete removal of tungsten residuals. These dry etch procedures would attack the exposed seam, 11a, shown in FIG. 2, and create an undesirable larger seam, or void, 11b, shown in FIG. 3. Therefore this invention concentrates on not exposing seam, 17, shown in FIG. 5, to tungsten etch back procedures. This is accomplished by depositing a aluminum based, interconnect metallization layer, 18, containing between about 1 to 3% copper, via r.f. sputtering, to a thickness between about 4000 to 8000 Angstroms. Next another layer of titanium nitride, 19, is deposited using r.f. sputtering, to a thickness between about 500 to 1000 Angstroms. Titanium nitride layer, 19, serves as both an anti-reflective coating for optimization of subsequent photolithographic procedures, as well as a protective layer for the subsequent aluminum based interconnect structure, during a self-aligned tungsten etch back process. These layers are shown schematically in FIG. 6.

Figure 7:
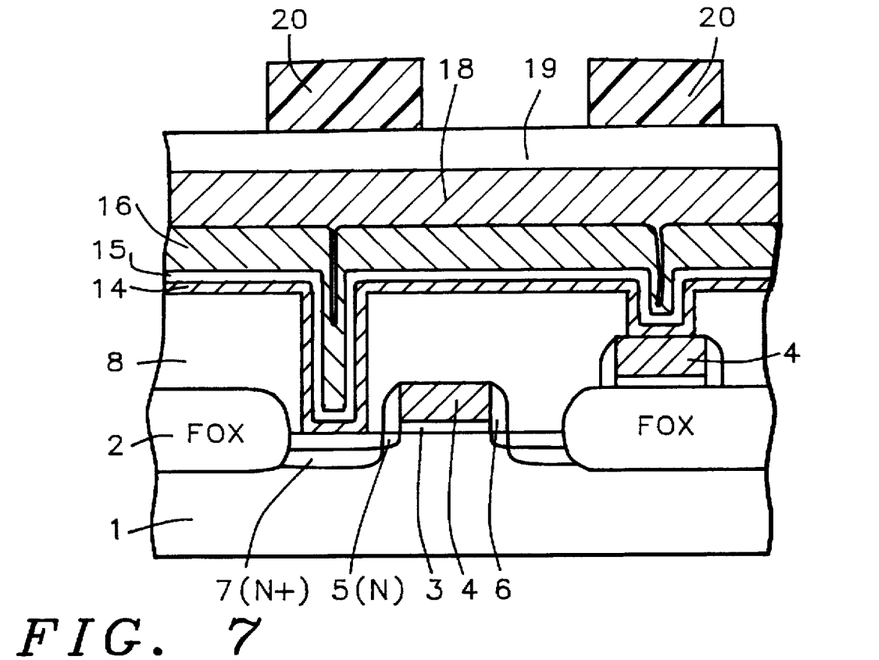
Figure 8:
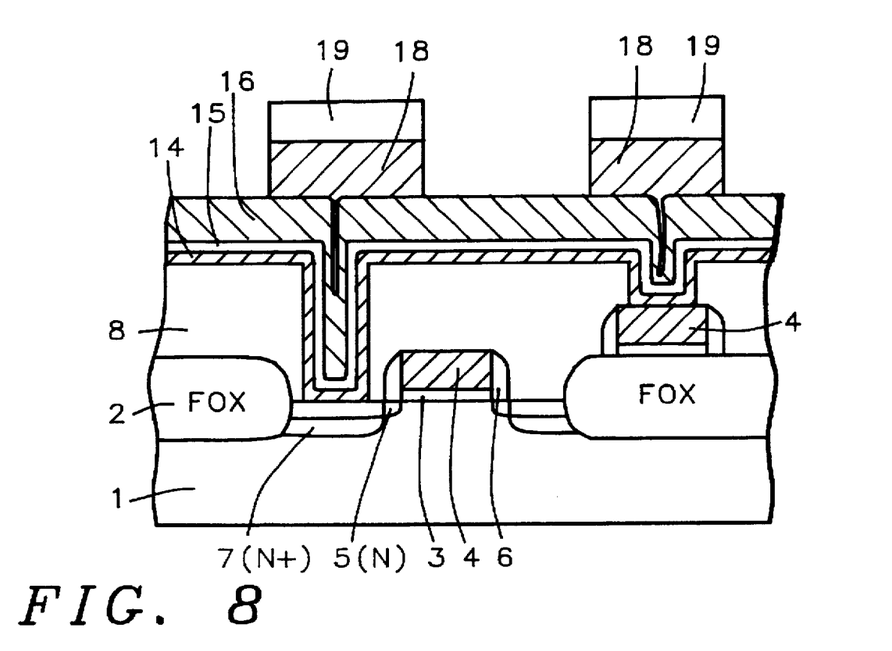
Figure 9:
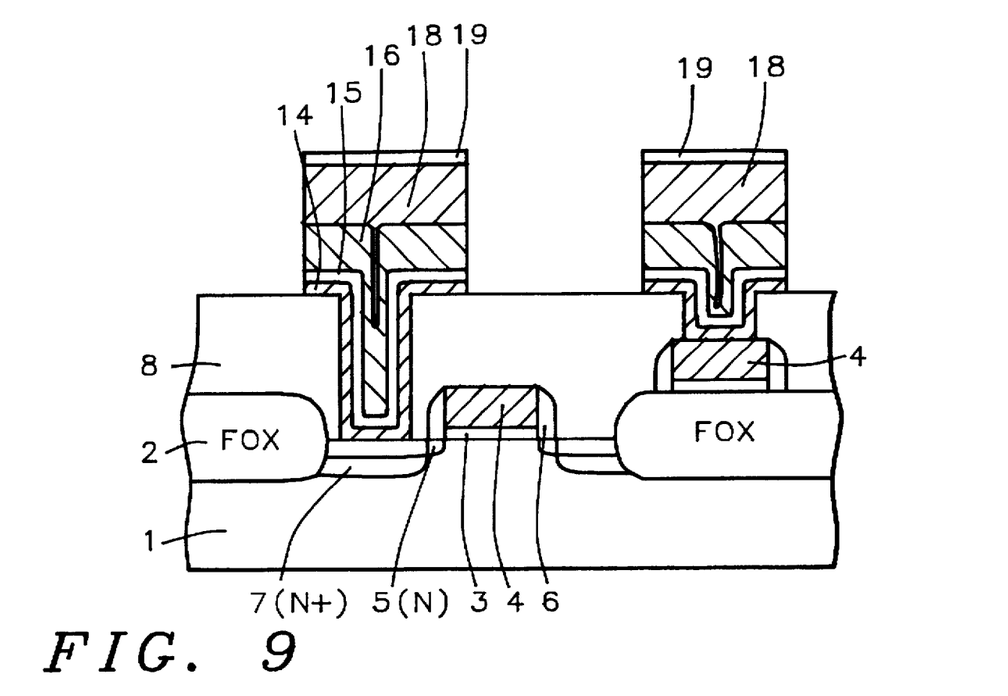

A photoresist shape, 20, shown in FIG. 7, is formed and used as a mask to pattern underlying titanium nitride layer, 19, and aluminum based, interconnect metallization layer, 18, via anisotropic, RIE procedures, using $BCl_3$ and $Cl_2$ as an etchant. At the conclusion of the RIE procedure, photoresist shape, 20, is removed via plasma oxygen ashing, followed by wet cleans, resulting in the composite interconnect metallization structure of overlying titanium nitride, 19, and an underlying aluminum based layer, 18, shown in FIG. 8. The removal of the unwanted tungsten is next addressed by using the composite interconnect structure as a mask, to protect seam, 17, from the dry etch procedures. A RIE procedure using $SF_6$ as an etchant is used to etch exposed tungsten, 16, as well as exposed titanium nitride layer, 15, and titanium layer, 14, in areas not covered by the masking interconnect metallization structure. This procedure, resulting in a tungsten structure, including the tungsten plug, in the small diameter contact hole, is self-aligned to the overlying interconnect metallization structure, and shown schematically in FIG. 9. Of great importance is the protection offered by the overlying interconnect structure, to the underlying tungsten plug, during the tungsten definition process, not allowing seam, 17, to be exposed to this etch back process. Titanium nitride layer, 19, exposed to the tungsten, 16, as well as to the titanium nitride, 15, and titanium, 14, etch back procedures, results in a final thickness between about 100 to 500 Angstroms.

This process, although shown for forming self-aligned tungsten structures, used to fill contact holes, connecting overlying interconnect metallization structures to underlying active silicon device regions, can also be applied to tungsten structures filling via holes, used to interconnect two levels of metallizations.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, using a metal filled contact hole, to provide electrical contact between an underlying conductive region, on said semiconductor substrate, and an overlying interconnect metallization structure, comprising the steps of:

providing said underlying conductive region, on said semiconductor substrate;

depositing a dielectric layer on said semiconductor substrate, including deposition on said underlying conductive region;

photolithographic processing to open a hole, with a diameter between about 0.3 by 0.5 microns, in a photoresist layer, exposing underlying said dielectric layer, directly over an area of said underlying conductive region;

anisotropic etching of said dielectric layer, using said hole, in said photoresist layer as a mask, to create a contact hole, with a diameter between about 0.3 to 0.5 microns, in said dielectric layer, to said underlying conductive region;

removal of said photoresist layer;

surface cleaning of said underlying conductive region, in said contact hole;

collimated, R.F. sputter deposition of an adhesive layer on top surface of said dielectric layer, on sides of said contact hole, and on top surface of said underlying conductive region, in said contact hole;

a low pressure chemical vapor deposition of a barrier layer on said adhesive layer;

deposition of a metal fill layer, on said barrier layer, forming a metal plug in said contact hole, by completely filling said contact hole with said metal fill layer;

deposition of an interconnect metallization layer on said metal fill layer, including deposition on said metal plug, in said contact hole;

deposition of an anti-reflective layer, on said interconnect metallization layer;

photolithographic processing to form a photoresist shape on said anti-reflective layer, directly overlying said metal plug, in said contact hole;

anisotropic etching, using $BCl_3$ and $Cl_2$ as etchants to remove said anti-reflective layer, and said interconnect metallization layer, from areas not covered by said photoresist shape, forming a interconnect metallization structure, directly overlying said metal plug;

removal of said photoresist shape; and anisotropic etching, using $SF_6$ as an etchant, to remove said metal fill layer, of said barrier layer, and of said adhesive layer, in areas not covered by overlying said interconnect metallization structure.

2. The method of claim 1, wherein said underlying conductive region, on said semiconductor substrate, is an N type, heavily doped source and drain region, of a MOSFET device.

3. The method of claim 1, wherein said underlying conductive region, on said semiconductor substrate, is a polysilicon gate structure, of a MOSFET device.

4. The method of claim 1, wherein said dielectric layer is silicon oxide, deposited using either LPCVD, PECVD, or APCVD processing, at a temperature between about 400° to 800° C., to a thickness between about 5000 to 10000 Angstroms.

5. The method of claim 1, wherein said contact hole is created using anisotropic, RIE processing, using $CHF_3$ as an etchant, with said small diameter contact hole being formed with an opening between about 0.3 to 0.5 uM, in diameter, resulting in an aspect ratio between about 1 to 3.

6. The method of claim 1, wherein said adhesive layer is titanium, deposited using collimated r.f. sputtering, to a thickness between about 150 to 250 Angstroms.

7. The method of claim 1, wherein said barrier layer is titanium nitride deposited using LPCVD processing, at a temperature between about 200° to 600° C., to a thickness between about 100 to 200 Angstroms.

8. The method of claim 1, wherein said metal fill layer is tungsten, deposited using LPCVD processing, at a temperature between about 100° to 500° C., to a thickness between about 2000 to 8000 Angstroms, using tungsten hexafluoride and silane.

9. The method of claim 1, wherein said interconnect metallization layer is aluminum, containing between about 1 to 3% copper, deposited using r.f. sputtering, to a thickness between about 4000 to 8000 Angstroms.

10. The method of claim 1, wherein said anti-reflective layer is titanium nitride, deposited using r.f. sputtering, to a thickness between about 500 to 1000 Angstroms.

11. A method for fabricating a MOSFET device, on a semiconductor substrate, using a tungsten filled contact hole, to provide electrical contact between an underlying conductive region on said semiconductor substrate, and an overlying interconnect metallization structure, comprising the steps of:

providing said underlying conductive region, on said semiconductor substrate;

depositing a dielectric layer on said semiconductor substrate, including deposition on said underlying conductive region;

photolithographic processing to open a hole, with a diameter between about 0.3 to 0.5 microns, in a photoresist layer, exposing underlying said dielectric layer, directly over an area of said underlying conductive region;

anisotropic etching of said dielectric layer, in said hole, in said photoresist layer, to create a contact hole, with a diameter between about 0.3 to 0.5 microns, to said underlying conductive region;

removal of said photoresist layer;

surface cleaning of said underlying conductive region, in said contact hole;

collimated, R.F. sputter deposition of a titanium layer on the top surface of said dielectric layer, on the sides of said contact hole, and on the top surface of said underlying conductive region, in said contact hole;

low pressure chemical vapor deposition of a first titanium nitride layer on said titanium layer;

deposition of a tungsten layer, on said first titanium nitride layer, forming a tungsten plug in said contact hole, by completely filling said contact hole with said tungsten layer;

deposition of an aluminum based, interconnect metallization layer, on said tungsten layer, including deposition on said tungsten plug, in said contact hole;

deposition of a second titanium nitride layer, on said aluminum based, interconnect metallization layer;

photolithographic processing to form a photoresist shape on said second titanium nitride layer, directly overlying said tungsten plug, in said contact hole;

anisotropic etching, using $BCl_3$ and $Cl_2$ as etchants, to remove said second titanium nitride layer, and said aluminum based, interconnect metallization layer, from areas not covered by said photoresist shape, forming an aluminum based interconnect structure, directly overlying said tungsten plug;

removal of said photoresist shape; and anisotropic etching, using $SF_6$ as an etchant, to remove said tungsten layer, said first titanium nitride layer, and said titanium layer, in areas not covered by overlying said aluminum based, interconnect metallization structure.

12. The method of claim 11, wherein said underlying conductive region, on said semiconductor substrate, is an N type, heavily doped source and drain region, of a MOSFET device.

13. The method of claim 11, wherein said underlying conductive region, on said semiconductor substrate, is a polysilicon gate structure, of a MOSFET device.

14. The method of claim 11, wherein said dielectric layer is silicon oxide, deposited using either LPCVD, PECVD, or APCVD processing, at a temperature between about 400° to 800° C., to a thickness between about 5000 to 10000 Angstroms.

15. The method of claim 11, wherein said contact hole is created using anisotropic, RIE processing, using $CHF_3$ as an etchant, with said small diameter contact hole being formed with an opening between about 0.3 to 0.5 uM, in diameter, resulting in an aspect ratio between about 1 to 3.

16. The method of claim 11, wherein said titanium layer is deposited using collimated, r.f. sputtering, to a thickness between about 150 to 250 Angstroms.

17. The method of claim 11, wherein said first titanium nitride layer is deposited using LPCVD processing, at a temperature between about 200° to 600° C., to a thickness between about 100 to 200 Angstroms.

18. The method of claim 11, wherein said tungsten layer is deposited using LPCVD processing, at a temperature between about 100° to 500° C., to a thickness between about 2000 to 8000 Angstroms, using tungsten hexafluoride and silane.

19. The method of claim 11, wherein said aluminum based, interconnect metallization layer, is aluminum, containing between about 1 to 3% copper, deposited using r.f. sputtering, to a thickness between about 4000 to 8000 Angstroms.

20. The method of claim 11, wherein said second titanium nitride layer is deposited using r.f. sputtering, to a thickness between about 500 to 1000 Angstroms.

* * * * *

UNITED STATES PATENT AND TRADEMARK OFFICE
CERTIFICATE OF CORRECTION

PATENT NO. : 5,801,096
DATED : 9/1/98
INVENTOR(S) : Chung-Kuang Lee and Pin-Nan Tseng It is certified that error appears in the above-indentified patent and that said Letters Patent is hereby corrected as shown below:

Title page, item [54] & col. 1, line 1, delete "TUNGSEN" and replace with --TUNGSTEN--.

Signed and Sealed this

First Day of December, 1998

Attest:

BRUCE LEHMAN

Attesting Officer

Commissioner of Patents and Trademarks